United States Patent
Li et al.

(10) Patent No.: US 12,245,393 B2
(45) Date of Patent: Mar. 4, 2025

(54) CHASSIS DEVICE FOR A DETACHABLE MODULE, RELATED ELECTRONIC APPARATUS AND RELATED OPERATING ASSEMBLY

(71) Applicant: Wistron Corporation, New Taipei (TW)

(72) Inventors: Bi Ying Li, New Taipei (TW); Jun Hao Wang, New Taipei (TW); Hua-Jun Liang, New Taipei (TW)

(73) Assignee: Wistron Corporation, New Taipei (TW)

( * ) Notice: Subject to any disclaimer, the term of this patent is extended or adjusted under 35 U.S.C. 154(b) by 240 days.

(21) Appl. No.: 17/978,950

(22) Filed: Nov. 1, 2022

(65) Prior Publication Data
US 2024/0040729 A1 Feb. 1, 2024

(30) Foreign Application Priority Data
Jul. 26, 2022 (CN) .......................... 202210885857.0

(51) Int. Cl.
*H05K 7/14* (2006.01)
*G11B 33/12* (2006.01)
*H05K 5/02* (2006.01)

(52) U.S. Cl.
CPC ............ *H05K 7/14* (2013.01); *G11B 33/124* (2013.01); *H05K 5/023* (2013.01)

(58) Field of Classification Search
None
See application file for complete search history.

(56) References Cited

U.S. PATENT DOCUMENTS

| 10,485,123 | B1 * | 11/2019 | Lin | H05K 5/0221 |
| 10,863,647 | B1 * | 12/2020 | Escamilla | H05K 5/023 |
| 2011/0273850 | A1 * | 11/2011 | Chen | H05K 5/023 |
| | | | | 292/336.3 |
| 2022/0418139 | A1 * | 12/2022 | Wang | G06F 1/187 |

FOREIGN PATENT DOCUMENTS

| CN | 209949696 U | 1/2020 |
| TW | 201328476 A1 | 7/2013 |
| TW | 202046845 A | 12/2020 |

* cited by examiner

*Primary Examiner* — James Wu
*Assistant Examiner* — Christopher L Augustin
(74) *Attorney, Agent, or Firm* — Winston Hsu

(57) ABSTRACT

A chassis device is provided and includes a case and an operating assembly. The case is for installing a detachable module and includes a first pivoting component pivotally connected to the detachable module, a second pivoting component pivotally connected to the first pivoting component, and a first engaging component movably disposed on the first pivoting component and for removably engaging with a second engaging component of the detachable module. The first pivoting component is restrained from pivoting when the first engaging component engages with the second engaging component of the detachable module, and when the second pivoting component pivots, the second pivoting component pushes the first engaging component, so that the first engaging component disengages from the second engaging component of the detachable module for allowing the first pivoting component to pivot. Furthermore, a related electronic apparatus and a related operating assembly are also provided.

20 Claims, 14 Drawing Sheets

CHASSIS DEVICE FOR A DETACHABLE MODULE, RELATED ELECTRONIC APPARATUS AND RELATED OPERATING ASSEMBLY

BACKGROUND OF THE INVENTION

1. Field of the Invention

The present invention relates to a chassis device for a detachable module, a related electronic apparatus and a related operating assembly, and more specifically, to a chassis device for a detachable module with simple structure and easy operation, a related electronic apparatus and a related operating assembly.

2. Description of the Prior Art

In order to satisfy different requirements in different application fields, modularity has gradually become a mainstream trend of electronic apparatuses. A conventional modular electronic apparatus usually includes a case and at least one detachable module installed on the case. The detachable module can be, for example, a graphics processing module having a plurality of graphics processing units. The detachable module is usually equipped with a handle for a user to grab. When it is desired to withdraw or remove the detachable module, the user can grab the handle to pull the detachable module by overcoming a mating force between an electrical connector of the detachable module and an electrical connector of a circuit board to be connected. However, it is not easy to withdraw or remove the detachable module due to the large mating force between the two electrical connectors. Furthermore, there is another conventional modular electronic apparatus equipped with a labor-saving handle. However, such handle has complicated structure, which affects an internal space arrangement. Therefore, an improvement is urgently needed.

SUMMARY OF THE INVENTION

Therefore, it is an objective of the present invention to provide a chassis device for a detachable module with simple structure and easy operation, a related electronic apparatus and a related operating assembly for solving the aforementioned problem.

In order to achieve the aforementioned objective, the present invention discloses a chassis device for a detachable module. The chassis device includes a case and an operating assembly. The case is for installing the detachable module. The operating assembly includes at least one first pivoting component, a second pivoting component and at least one first engaging component. The at least one first pivoting component is pivotally connected to the detachable module. The second pivoting component is pivotally connected to the at least one first pivoting component. The at least one first engaging component is movably disposed on the at least one first pivoting component. The at least one first engaging component is for removably engaging with at least one second engaging component of the detachable module. The at least one first pivoting component is restrained from pivoting when the at least one first engaging component engages with the at least one second engaging component of the detachable module, and when the second pivoting component pivots to push the at least one first engaging component, the at least one first engaging component disengages from the at least one second engaging component of the detachable module.

According to an embodiment of the present invention, the at least one first pivoting component includes a first pushing portion. The case includes at least one abutting component. The at least one abutting component includes a first pushed portion. When the second pivoting component pivots in a first pivoting direction, the second pivoting component pushes the at least one first engaging component to move in a first moving direction, so that the at least one first engaging component disengages from the at least one second engaging component, and the first pushing portion pushes the first pushed portion to drive the detachable module to move relative to the case in a detaching direction when the at least one first pivoting component pivots in a second pivoting direction opposite to the first pivoting direction.

According to an embodiment of the present invention, the at least one first pivoting component further includes a second pushing portion. The at least one abutting component further includes a second pushed portion, and the second pushing portion pushes the second pushed portion to drive the detachable module to move relative to the case in an installing direction opposite to the detaching direction when the at least one first pivoting component pivots in the first pivoting direction.

According to an embodiment of the present invention, the at least one first pivoting component further includes an arc-shaped recess structure. The first pushing portion and the second pushing portion are respectively located at two opposite sides of the arc-shaped recess structure, and the at least one abutting component is partially located within the arc-shaped recess structure.

According to an embodiment of the present invention, the first pushing portion does not abut against the first pushed portion and the second pushing portion abuts against the second pushed portion when the at least one first engaging component engages with the at least one second engaging component of the detachable module.

According to an embodiment of the present invention, the second pivoting component includes at least one bending portion and an operating portion. The at least one bending portion includes a first connecting end and a second connecting end. The first connecting end is pivotally connected to the at least one first pivoting component. The second connecting end is connected to the operating portion.

According to an embodiment of the present invention, the operating assembly further includes at least one first guiding component and at least one second guiding component. The at least one first guiding component is disposed on the at least one first pivoting component. The at least one second guiding component is disposed on the at least one first engaging component and configured to cooperate with the at least one first guiding component.

According to an embodiment of the present invention, the operating assembly further includes at least one recovering component disposed between the at least one first engaging component and the at least one first pivoting component.

According to an embodiment of the present invention, the at least one first pivoting component includes a stopping structure configured to restrain a pivoting angle of the second pivoting component relative to the at least one first pivoting component.

In order to achieve the aforementioned objective, the present invention further discloses an electronic apparatus. The electronic apparatus includes a chassis device and a detachable module. The chassis device includes an operating assembly and a case. The operating assembly includes at least one first pivoting component, a second pivoting component pivotally connected to the at least one first pivoting component and at least one first engaging component movably disposed on the at least one first pivoting component. The detachable module is installed on the case. The at least one first pivoting component is pivotally connected to the detachable module. The detachable module includes at least one second engaging component. The at least one first engaging component is for removably engaging with the at least one second engaging component. The at least one first pivoting component is restrained from pivoting when the at least one first engaging component engages with the at least one second engaging component, and when the second pivoting component pivots to push the at least one first engaging component, the at least one first engaging component disengages from the at least one second engaging component.

According to an embodiment of the present invention, the at least one first pivoting component includes a first pushing portion. The case includes at least one abutting component. The at least one abutting component includes a first pushed portion. When the second pivoting component pivots in a first pivoting direction, the second pivoting component pushes the at least one first engaging component to move in a first moving direction, so that the at least one first engaging component disengages from the at least one second engaging component of the detachable module, and the first pushing portion pushes the first pushed portion to drive the detachable module to move relative to the case in a detaching direction when the at least one first pivoting component pivots in a second pivoting direction opposite to the first pivoting direction.

According to an embodiment of the present invention, the at least one first pivoting component further includes a second pushing portion. The at least one abutting component further includes a second pushed portion, and the second pushing portion pushes the second pushed portion to drive the detachable module to move relative to the case in an installing direction opposite to the detaching direction when the at least one first pivoting component pivots in the first pivoting direction.

According to an embodiment of the present invention, the at least one first pivoting component further includes an arc-shaped recess structure. The first pushing portion and the second pushing portion are respectively located at two opposite sides of the arc-shaped recess structure, and the at least one abutting component is partially located within the arc-shaped recess structure.

According to an embodiment of the present invention, the second pivoting component includes at least one bending portion and an operating portion. The at least one bending portion includes a first connecting end and a second connecting end. The first connecting end is pivotally connected to the at least one first pivoting component. The second connecting end is connected to the operating portion.

According to an embodiment of the present invention, the operating assembly further includes at least one first guiding component and at least one second guiding component. The at least one first guiding component is disposed on the at least one first pivoting component. The at least one second guiding component is disposed on the at least one first engaging component and configured to cooperate with the at least one first guiding component.

According to an embodiment of the present invention, the operating assembly further includes at least one recovering component disposed between the at least one first engaging component and the at least one first pivoting component.

According to an embodiment of the present invention, the at least one first pivoting component includes a stopping structure configured to restrain a pivoting angle of the second pivoting component relative to the at least one first pivoting component.

In order to achieve the aforementioned objective, the present invention further discloses an operating assembly for a detachable module. The detachable module is installed on a case. The operating assembly includes at least one first pivoting component pivotally connected to the detachable module, a second pivoting component pivotally connected to the at least one first pivoting component, and at least one first engaging component movably disposed on the at least one first pivoting component and for removably engaging with at least one second engaging component of the detachable module. The at least one first pivoting component is restrained from pivoting when the at least one first engaging component engages with the at least one second engaging component, and when the second pivoting component pivots to push the at least one first engaging component, the at least one first engaging component disengages from the at least one second engaging component.

According to an embodiment of the present invention, the at least one first pivoting component includes a first pushing portion. When the second pivoting component pivots in a first pivoting direction, the second pivoting component pushes the at least one first engaging component to move in a first moving direction, so that the at least one first engaging component disengages from the at least one second engaging component of the detachable module, and the first pushing portion pushes a first pushed portion of at least one abutting component of the case to drive the detachable module to move relative to the case in a detaching direction when the at least one first pivoting component pivots in a second pivoting direction opposite to the first pivoting direction.

According to an embodiment of the present invention, the at least one first pivoting component further includes a second pushing portion, and the second pushing portion pushes a second pushed portion of the at least one abutting component of the case to drive the detachable module to move relative to the case in an installing direction opposite to the detaching direction when the at least one first pivoting component pivots in the first pivoting direction.

In summary, the present invention utilizes the second pivoting component to drive the first engaging component to disengage from the second engaging component for allowing the first pivoting component to pivot relative to the detachable module. Besides, the present invention further utilizes the first pivoting component to push the abutting component for driving the detachable module to move in the detaching direction. The present invention allows a user to sequentially operate the second pivoting component and the first pivoting component to pivot to achieve detachment of the detachable module. Therefore, the present invention has better operability. In addition, the configuration of the present invention has fewer parts and occupies less space. Therefore, the present invention has simple structure and increased space utilization.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
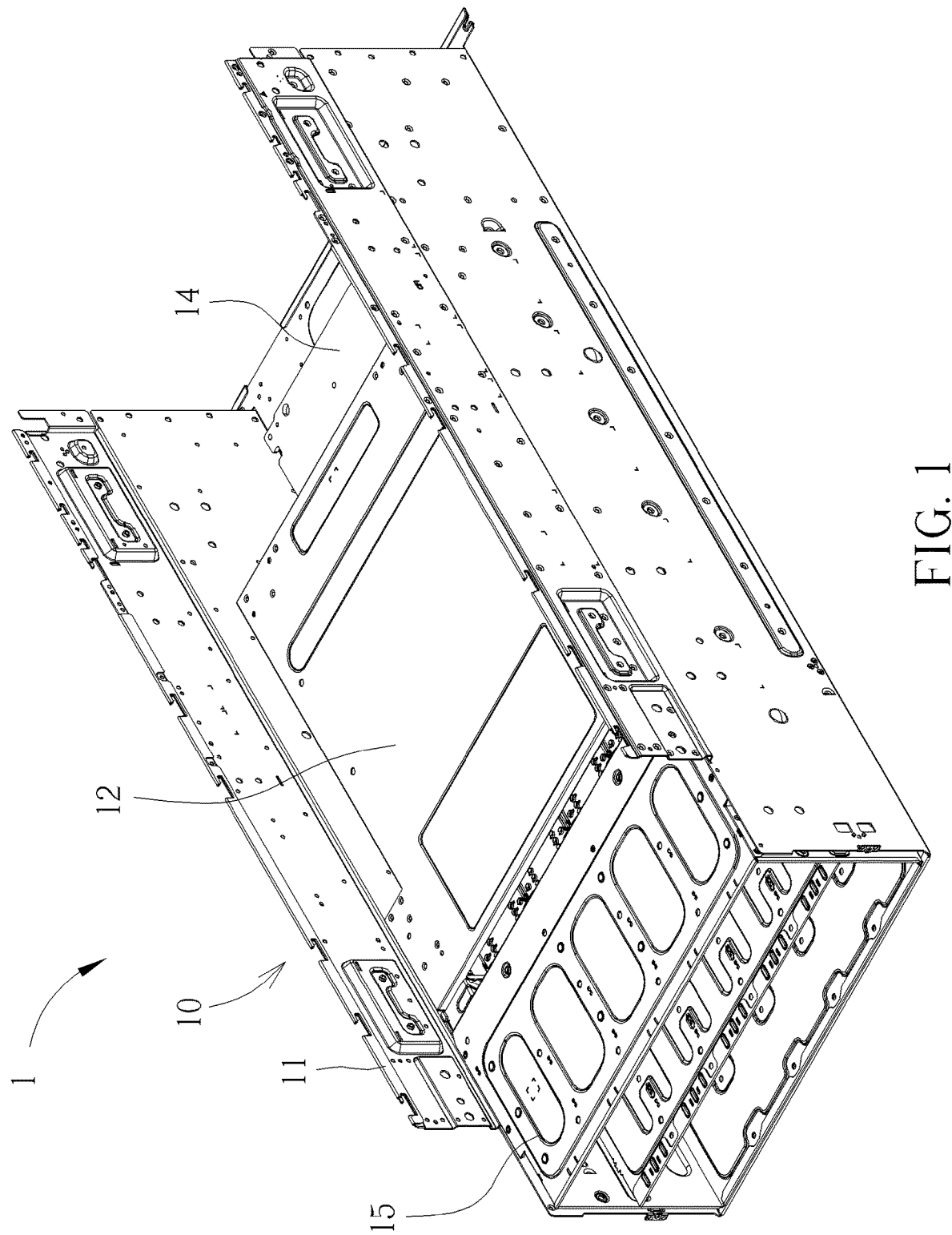
FIG. 1 is a partial diagram of an electronic apparatus according to an embodiment of the present invention.
Figure 2:
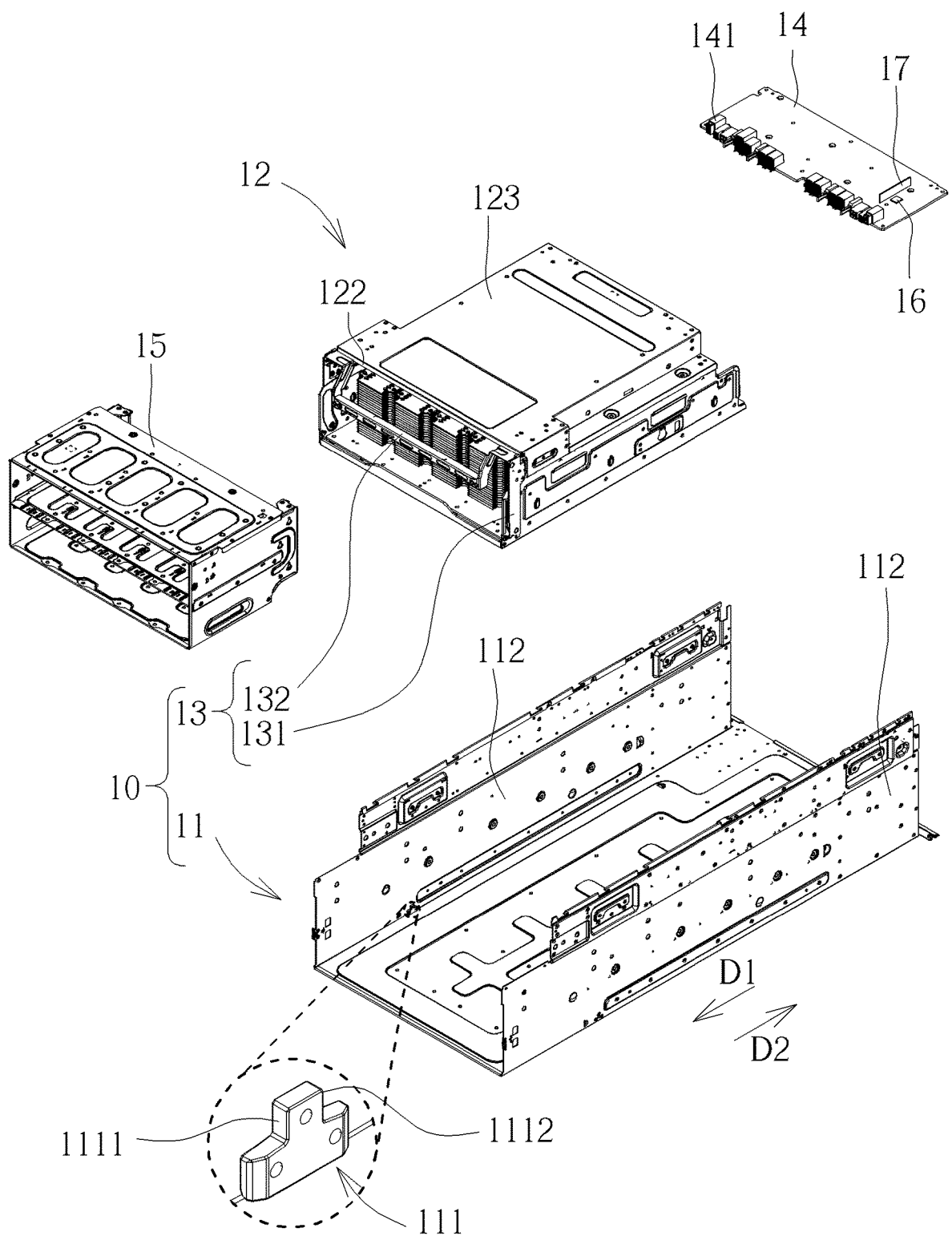
FIG. 2 and FIG. 3 are partial exploded diagrams of the electronic apparatus according to the embodiment of the present invention.
Figure 3:
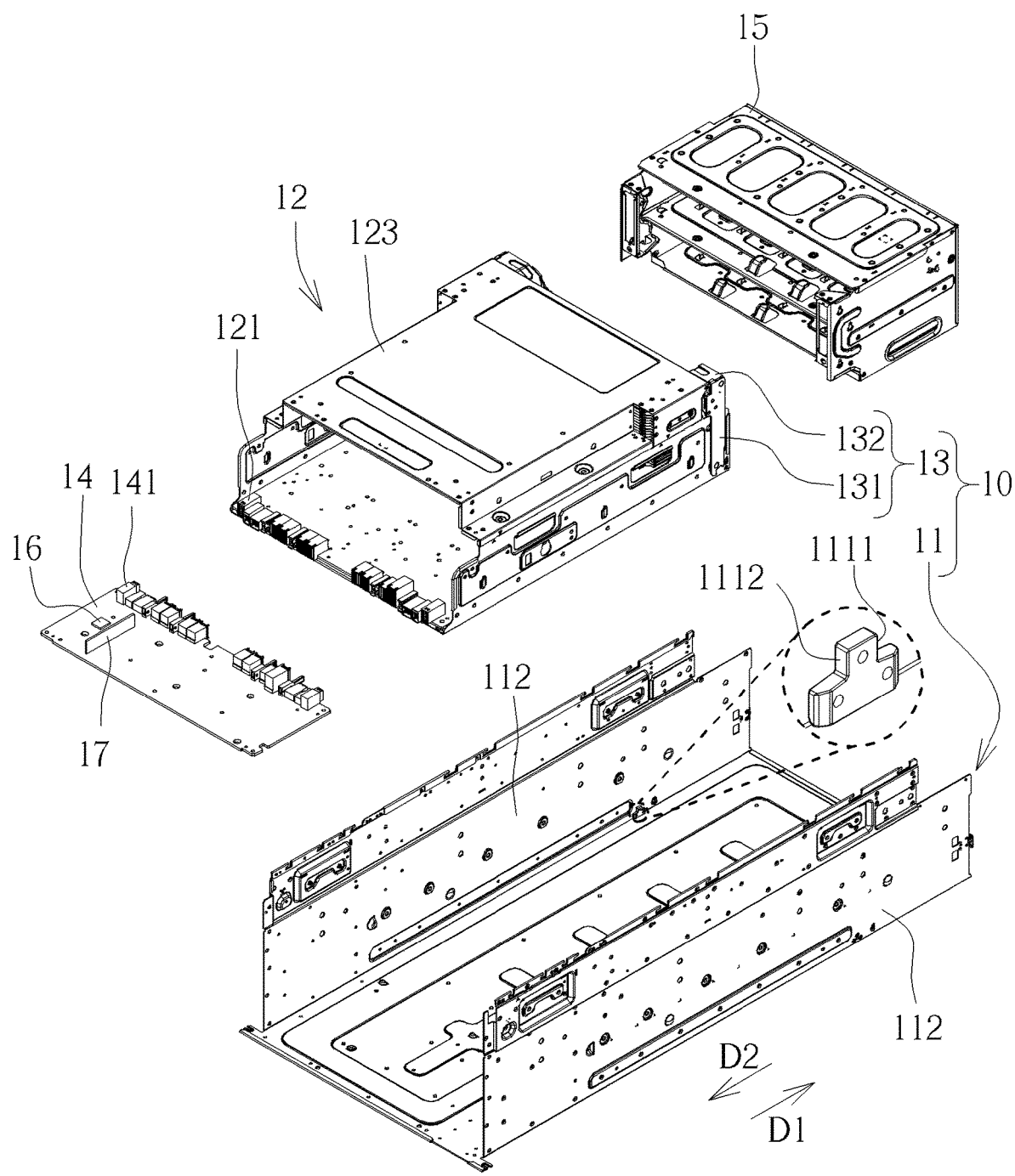
Figure 4:
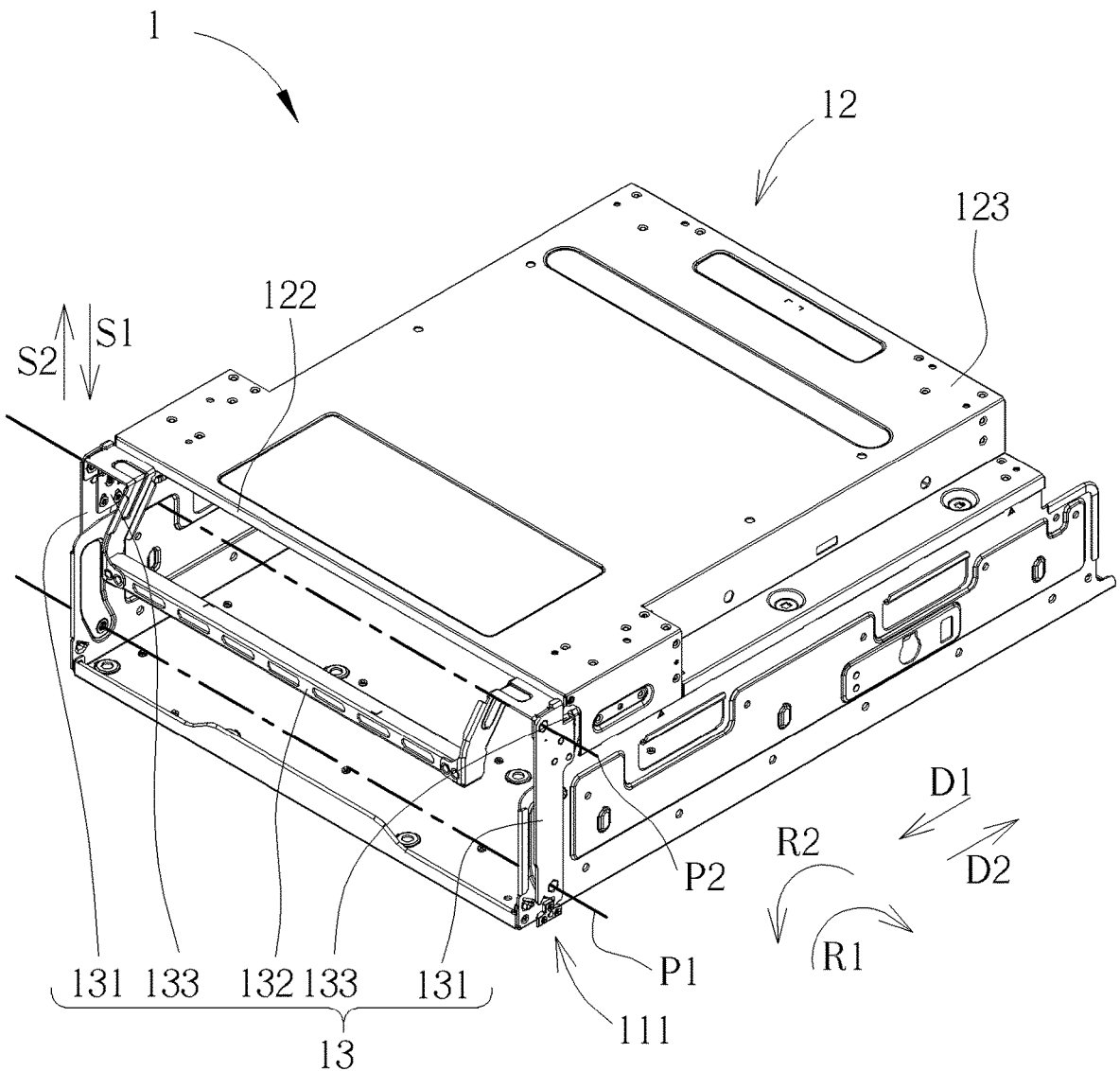
FIG. 4 is a partial enlarged diagram of the electronic apparatus according to the embodiment of the present invention.

Please refer to FIG. 1 to FIG. 4. FIG. 1 is a partial diagram of an electronic apparatus 1 according to an embodiment of the present invention. FIG. 2 and FIG. 3 are partial exploded diagrams of the electronic apparatus 1 according to the embodiment of the present invention. FIG. 4 is a partial enlarged diagram of the electronic apparatus 1 according to the embodiment of the present invention. As shown in FIG. 1 to FIG. 4, the electronic apparatus 1 includes a chassis device 10 and a detachable module 12. The chassis device 10 includes a case 11 and an operating assembly 13. The detachable module 12 is detachably installed on the case 11. The operating assembly 13 is for driving the detachable module 12 to move relative to the case 11 for achieving installation or detachment of the detachable module 12 relative to the case 11.

In this embodiment, the electronic apparatus 1 can be a server. The detachable module 12 can be a graphics processing module having a plurality of graphics processing units (GPU). The detachable module 12 can include at least one first electrical connector 121. The electronic apparatus 1 can further include a circuit board 14 disposed on the case 11 and configured to be electrically connected to the detachable module 12. At least one second electrical connector 141 can be disposed on the circuit board 14. The electronic apparatus 1 can further include at least one processor 16, at least one memory 17 and/or any other electrical element disposed on the circuit board 14. The operating assembly 13 can drive the detachable module 12 to move for mating the first electrical connector 121 with the second electrical connector 141 or for separating the first electrical connector 121 from the second electrical connector 141. The installation of the detachable module 12 onto the case 11 can be achieved by mating the first electrical connector 121 with the second electrical connector 141. The detachment of the detachable module 12 from the case 11 can be achieved by separating the first electrical connector 121 from the second electrical connector 141.

However, the present invention is not limited to this embodiment. For example, in another embodiment, the electronic apparatus can be an industrial computer or a personal computer. The detachable module can be a redundant array of independent disks (RAID) module having a plurality of hard disk drives or a fan module having a plurality of fans. Alternatively, in another embodiment, the installation of the detachable module onto the case can be achieved by moving the detachable module to a predetermined position, and the detachment of the detachable module from the case can be achieved by moving the detachable module away from the predetermined position, i.e., the installation and the detachment of the detachable module relative to the case can be irrelevant to a mating state of the first electrical connector of the detachable module and the second electrical connector on the circuit board.

Figure 5:
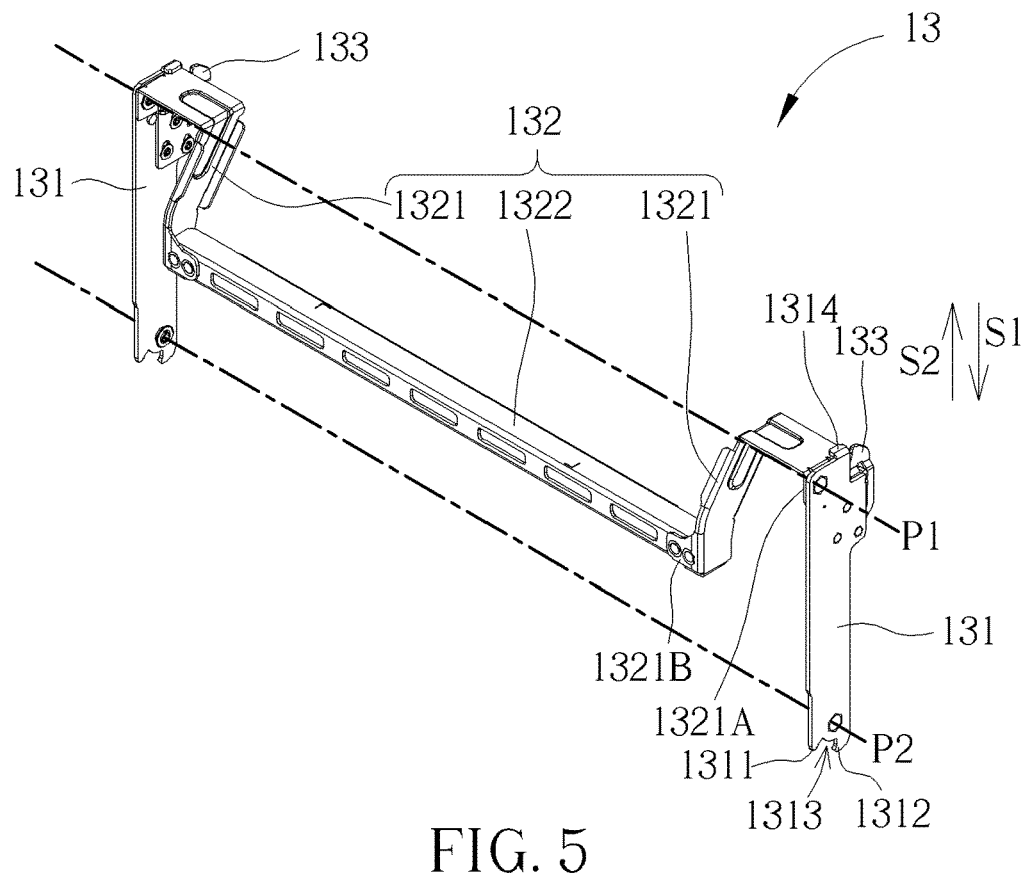
FIG. 5 and FIG. 6 are partial diagrams of an operating assembly at different views according to the embodiment of the present invention.
Figure 6:
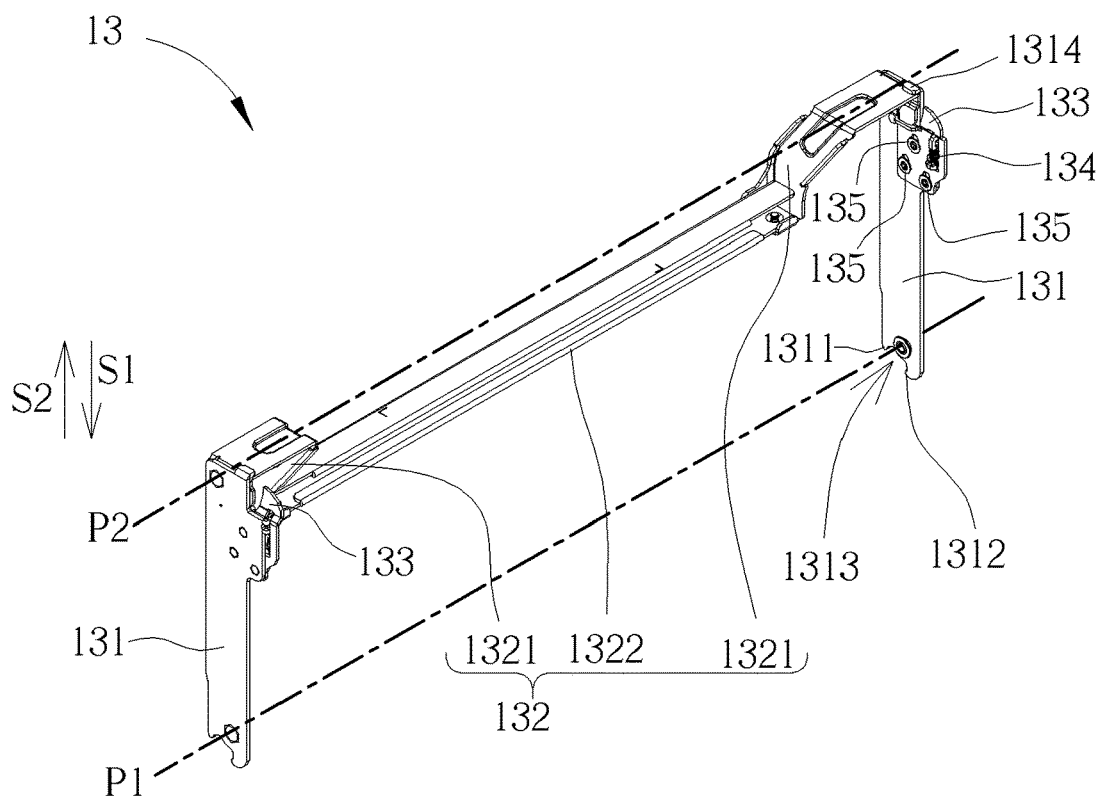
Figure 7:
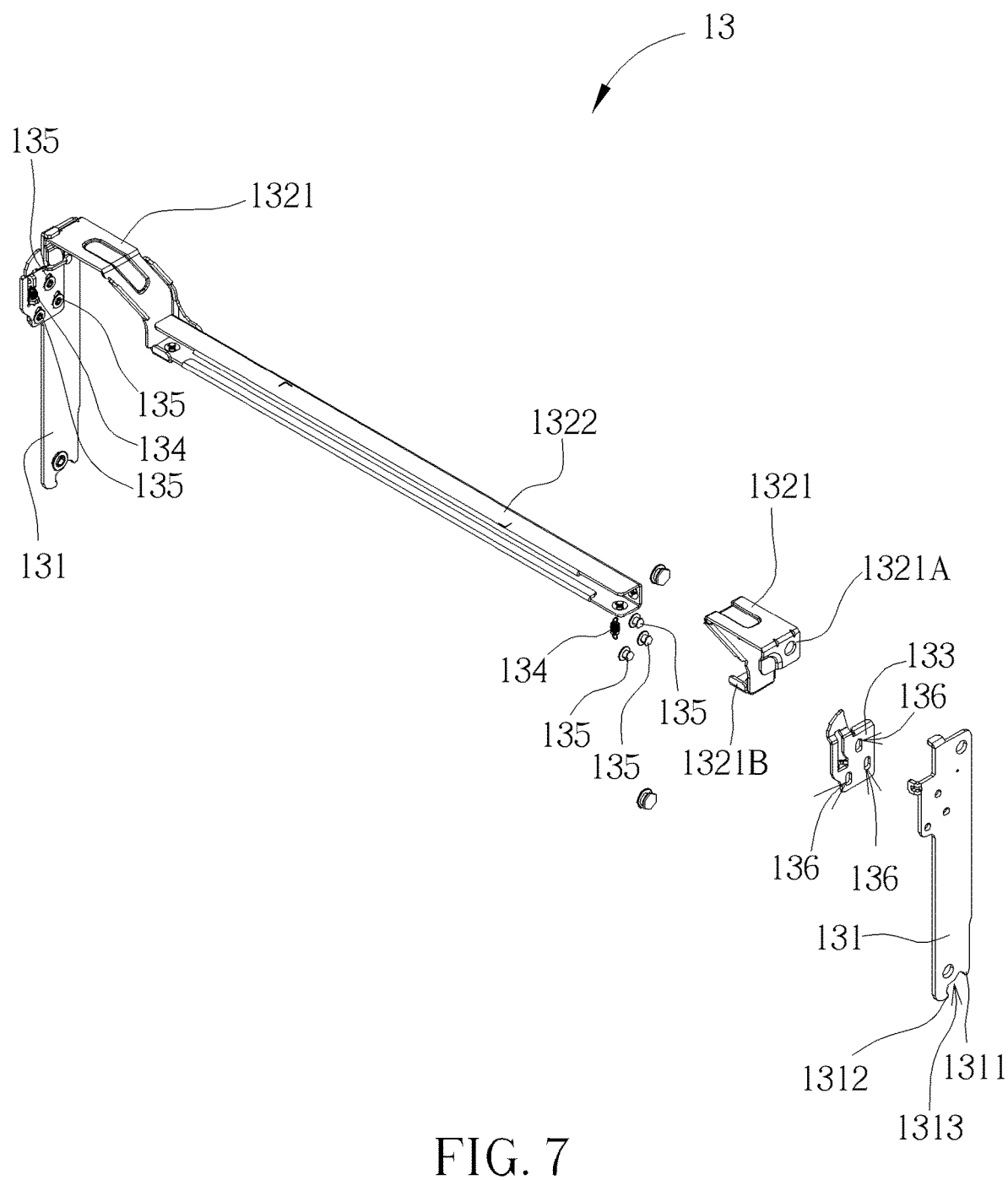
FIG. 7 is a partial exploded diagram of the operating assembly according to the embodiment of the present invention.

Please refer to FIG. 2 to FIG. 7. FIG. 5 and FIG. 6 are partial diagrams of the operating assembly 13 at different views according to the embodiment of the present invention. FIG. 7 is a partial exploded diagram of the operating assembly 13 according to the embodiment of the present invention. As shown in FIG. 2 to FIG. 7, the operating assembly 13 includes two first pivoting components 131, a second pivoting component 132 and two first engaging components 133. The detachable module 12 includes a second engaging component 122. The case 11 includes two abutting components 111. The two first pivoting components 131 are respectively pivotally connected to a left side and a right side of the detachable module 12. The second pivoting component 132 is located between the two first pivoting components 131, and two ends of the second pivoting component 132 are respectively pivotally connected to the two first pivoting components 131. The two first engaging components 133 are respectively movably disposed on the two first pivoting components 131. The second engaging component 122 is fixedly disposed on an upper side of a frame 123 of the detachable module 12. The two abutting components 111 are respectively fixedly disposed on two lateral plates 112 of the case 11 adjacent to the left side and the right side of the detachable module 12.

The two first pivoting components 131 are restrained from pivoting relative to the detachable module 12 when the two first engaging components 133 engage with the second engaging component 122. When the second pivoting component 132 pivots relative to the two first pivoting components 131, the second pivoting component 132 pushes the two first engaging components 133 for driving the two first engaging components 133 to disengage from the second engaging component 122, so that the two first pivoting components 131 are allowed to pivot relative to the detachable module 12. When the two first pivoting components 131 pivot relative to the detachable module 12, the two first pivoting components 131 respectively push the two abutting components 111 to drive the detachable module 12 to move relative to the case 11 in a detaching direction D1 for separating the first electrical connector 121 from the second electrical connector 141, or to move relative to the case 11 in an installing direction D2 opposite to the detaching direction D1 for mating the first electrical connector 121 with the second electrical connector 141.

However, the numbers and the configurations of the first pivoting component, the first engaging component, the second engaging component and the abutting component are not limited to this embodiment. For example, in another embodiment, the operating assembly can include two second engaging components configured to respectively engage with the two first engaging components. Alternatively, in another embodiment, the operating assembly can include one first pivoting component located at one side of the detachable module, one first engaging component, one second engaging component and one abutting component located at one side of the case.

Furthermore, as shown in FIG. 5 to FIG. 7, the operating assembly 13 further includes two recovering components 134. Each of the recovering components 134 is disposed between the corresponding first engaging component 133 and the corresponding first pivoting component 131. Each of the recovering components 134 can be an extension spring configured to drive the corresponding first engaging component 133 to engage with the second engaging component 122 when the corresponding first engaging component 133 is aligned with the second engaging component 122.

However, the present invention is not limited to this embodiment. For example, in another embodiment, the recovering component can be a compression spring, a leaf spring or a torsional spring. Alternatively, in another embodiment, the recovering component can be omitted, and the first engaging component can be configured to be driven by the second pivoting component to disengage from the second engaging component when the second pivoting component pivots in a first pivoting direction and further to be driven by the second pivoting component to engage with the second engaging component when the second pivoting component pivots in a second pivoting direction.

Specifically, as shown in FIG. 2 to FIG. 7, each of the first pivoting components 131 is pivotally disposed on the detachable module 12 and pivotable relative to the detachable module 12 around a first pivoting axis P1 in a first pivoting direction R1 and a second pivoting direction R2 opposite to the first pivoting direction R1. The second pivoting component 132 is pivotally connected to the two first pivoting components 131 and pivotable relative to the two first pivoting components 131 around a second pivoting axis P2 in the first pivoting direction R1 and the second pivoting direction R2. Each of the first engaging components 133 is movably disposed on the corresponding first pivoting component 131 and movable relative to the corresponding first pivoting component 131 in a first moving direction S1 and a second moving direction S2 opposite to the first moving direction S1. An extending direction of the first pivoting axis P1 and an extending direction of the second pivoting axis P2 are parallel to each other and not coincided with each other, and the extending direction of the first pivoting axis P1, the first moving direction S1 and the detaching direction D1 are perpendicular to one another.

When the second pivoting component 132 pivots relative to the two first pivoting components 131 around the first pivoting axis P1 in the first pivoting direction R1, the second pivoting component 132 pushes the two first engaging components 133 to move in the first moving direction S1, so that the two first engaging components 133 disengage from the second engaging component 122 for allowing the two first pivoting components 131 to pivot relative to the detachable module 12 around the second pivoting axis P2 in the second pivoting direction R2. When the two first pivoting components 131 pivot relative to the detachable module 12 in the second pivoting direction R2, the two first pivoting components 131 respectively push the two abutting components 111 for driving the detachable module 12 to move relative to the case 11 in the detaching direction D1. When the two first pivoting components 131 pivot relative to the detachable module 12 in the first pivoting direction R1, the two first pivoting components 131 respectively push the two abutting components 111 for driving the detachable module 12 to move relative to the case 11 in the installing direction D2.

More specifically, each of the first pivoting components 131 includes a first pushing portion 1311 and a second pushing portion 1312. Each of the abutting components 111 includes a first pushed portion 1111 and a second pushed portion 1112. When each of the first pivoting components 131 pivots relative to the detachable module 12 in the second pivoting direction R2, each of the first pushing portions 1311 pushes the corresponding first pushed portion 1111 for driving the detachable module 12 to move relative to the case 11 in the detaching direction D1. When each of the first pivoting components 131 pivots relative to the detachable module 12 in the first pivoting direction R1, each of the second pushing portions 1312 pushes the corresponding second pushed portion 1112 for driving the detachable module 12 to move relative to the case 11 in the installing direction D2.

Furthermore, in order to make structure of the operating assembly reasonable and compact, each of the first pivoting components 131 includes an arc-shaped recess structure 1313. The first pushing portion 1311 and the second pushing portion 1312 of each of the first pivoting components 131 are respectively located at two opposite sides of the arc-shaped recess structure 1313 of each of the first pivoting components 131. Each of the abutting components 111 is partially located within the corresponding arc-shaped recess structure 1313.

However, the present invention is not limited to this embodiment. For example, in another embodiment, the arc-shaped recess structure can be omitted, and the first pushing portion and the second pushing portion can protrude from a main body portion of the first pivoting component in the extending direction of the first pivoting direction.

Besides, in order to improve operability of the operating assembly 13, a distance between each of the first pushed portions 1111 and the corresponding second pushed portion 1112 can be less than a distance between each of the first pushing portions 1311 and the corresponding second pushing portion 1312, so that each of the first pushing portions 1311 does not abut against the corresponding first pushed portion 1111 and each of the second pushing portions 1312 abuts against the corresponding second pushed portion 1112 when the two first engaging components 133 engage with the second engaging component 122. The aforementioned configuration allows each of the first pivoting components 131 to pivot away from a vertical position in the second pivoting direction after disengaging the two first engaging components 133 from the second engaging component 122 until each of the first pushing portions 1311 abuts against the corresponding first pushed portion 1111 and each of the second pushing portions 1312 does not abut against the corresponding second pushed portion 1112. When each of the first pushing portions 1311 abuts against the corresponding first pushed portion 1111 and each of the second pushing portions 1312 does not abut against the corresponding second pushed portion 1112, each of the first pivoting components 131 is located at an inclined position, which facilitates a user to operate the operating assembly 13 for achieving the detachment of the detachable module 12 from the case 11.

However, the present invention is not limited to this embodiment. For example, in another embodiment, each of the first pushing portions and each of the second pushing portions can respectively abut against the corresponding first pushed portion and the corresponding second pushed portion when the two first engaging components engage with the second engaging component.

In addition, as shown in FIG. 5 to FIG. 7, the second pivoting component 132 includes two bending portions 1321 and an operating portion 1322. Each of the two bending portions 1321 includes a first connecting end 1321A and a second connecting end 1321B. Each of the first connecting ends 1321A is pivotally connected to the corresponding first pivoting component 131. Each of the second connecting ends 1321B is connected to the operating portion 1322. The operating portion 1322 drives the second pivoting component 132 to pivot relative to the two first pivoting components 131 when the operating portion 1322 is operated. The two bending portions 1321B are for avoiding any interference between the second pivoting component 132 and another structure, such as a fan module 15 located beside the detachable module 12, and for providing an enough operating space for the user's hand.

However, the present invention is not limited to this embodiment. For example, in another embodiment, the bending portion can be omitted.

Moreover, as shown in FIG. 5 to FIG. 7, the operating assembly 13 further includes six first guiding components 135 and six second guiding components 136. Three of the six first guiding components 135 are disposed on one of the two first pivoting components 131. The other three of the six first guiding components 135 are disposed on the other one of the two first pivoting components 131. Three of the six second guiding components 136 are disposed on one of the two first engaging components 133. The other three of the six second guiding components 136 are disposed on the other one of the two first engaging components 133. When the second pivoting component 132 pivots relative to the two first pivoting components 131, each of the first pivoting components 131 pushed by the second pivoting component 132 is guided to move in the first moving direction S1 or the second moving direction S2 by a cooperation of the corresponding first guiding component 135 and the corresponding second guiding component 136.

However, the present invention is not limited to this embodiment. For example, in another embodiment, the operating assembly can include only one first guiding component and one second guiding component. Alternatively, in another embodiment, the first guiding component and the second guiding component can be omitted.

In this embodiment, each of the first guiding components 135 can be a guiding column formed by a screw component or a rivet component. Each of the second guiding components 136 can be a guiding slot structure for allowing the corresponding first guiding component 135 to pass therethrough. However, the present invention is not limited to this embodiment. For example, in another embodiment, the second guiding component can be a guiding column formed by a screw component or a rivet component, and the first guiding component can be a guiding slot structure for allowing the second guiding component to pass therethrough. Alternatively, in another embodiment, the first guiding component can be a guiding block, and the second guiding component can be a guiding track.

Furthermore, in order to ensure the operating assembly 13 to be operated reliably, as shown in FIG. 5 to FIG. 7, each of the first pivoting components 131 further includes a stopping structure 1314 for stopping the second pivoting component 132 to restrain a pivoting angle of the second pivoting component 132 relative to the corresponding first pivoting component 131 for preventing an excessive pivoting movement of the second pivoting component 132 in the first pivoting direction R1.

However, the present invention is not limited to this embodiment. For example, in another embodiment, the stopping structure for restraining the pivoting angle of the second pivoting component can be omitted.

Figure 8:
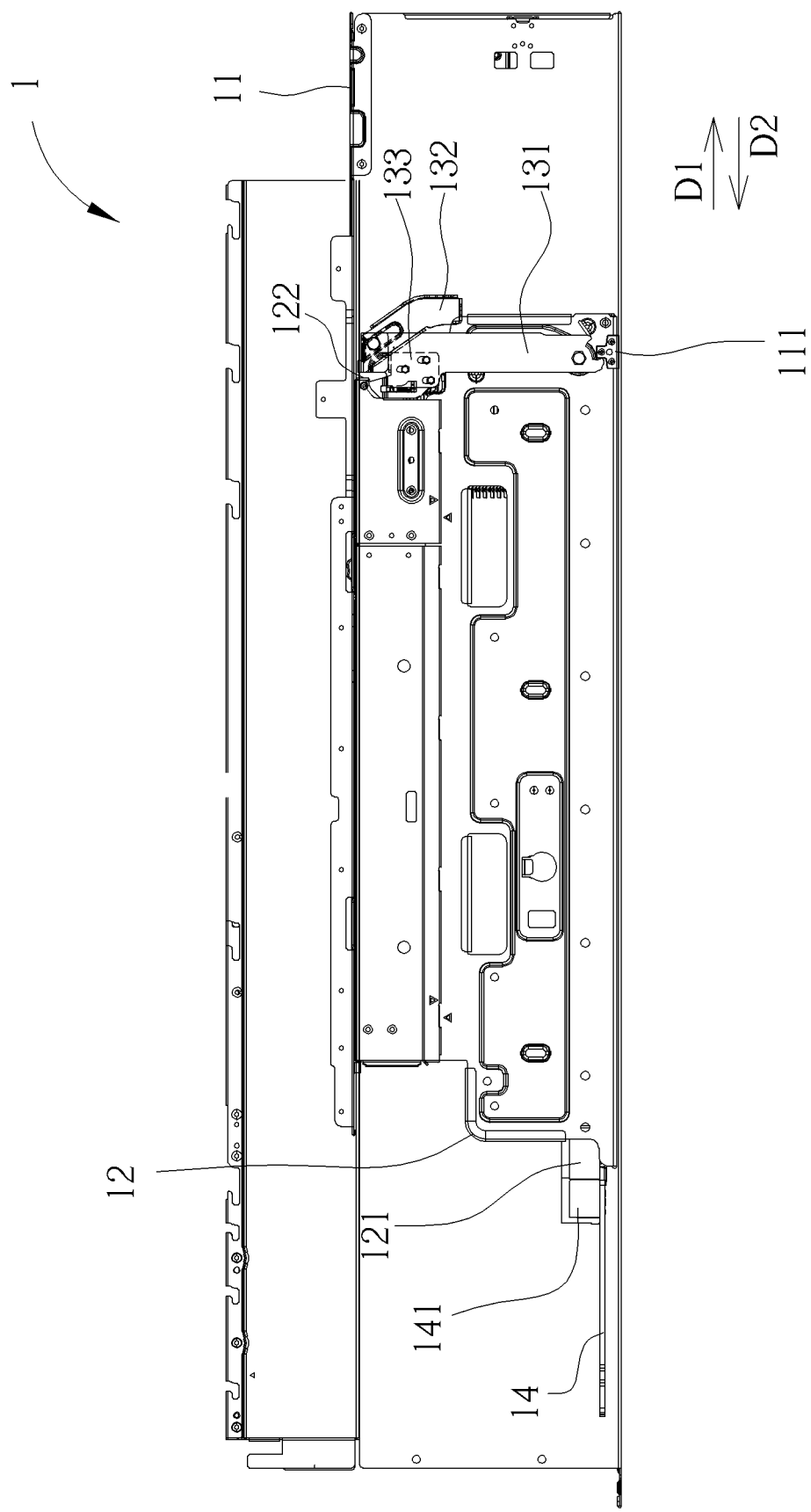
FIG. 8 is a diagram of the electronic apparatus in a first state according to the embodiment of the present invention.
Figure 9:
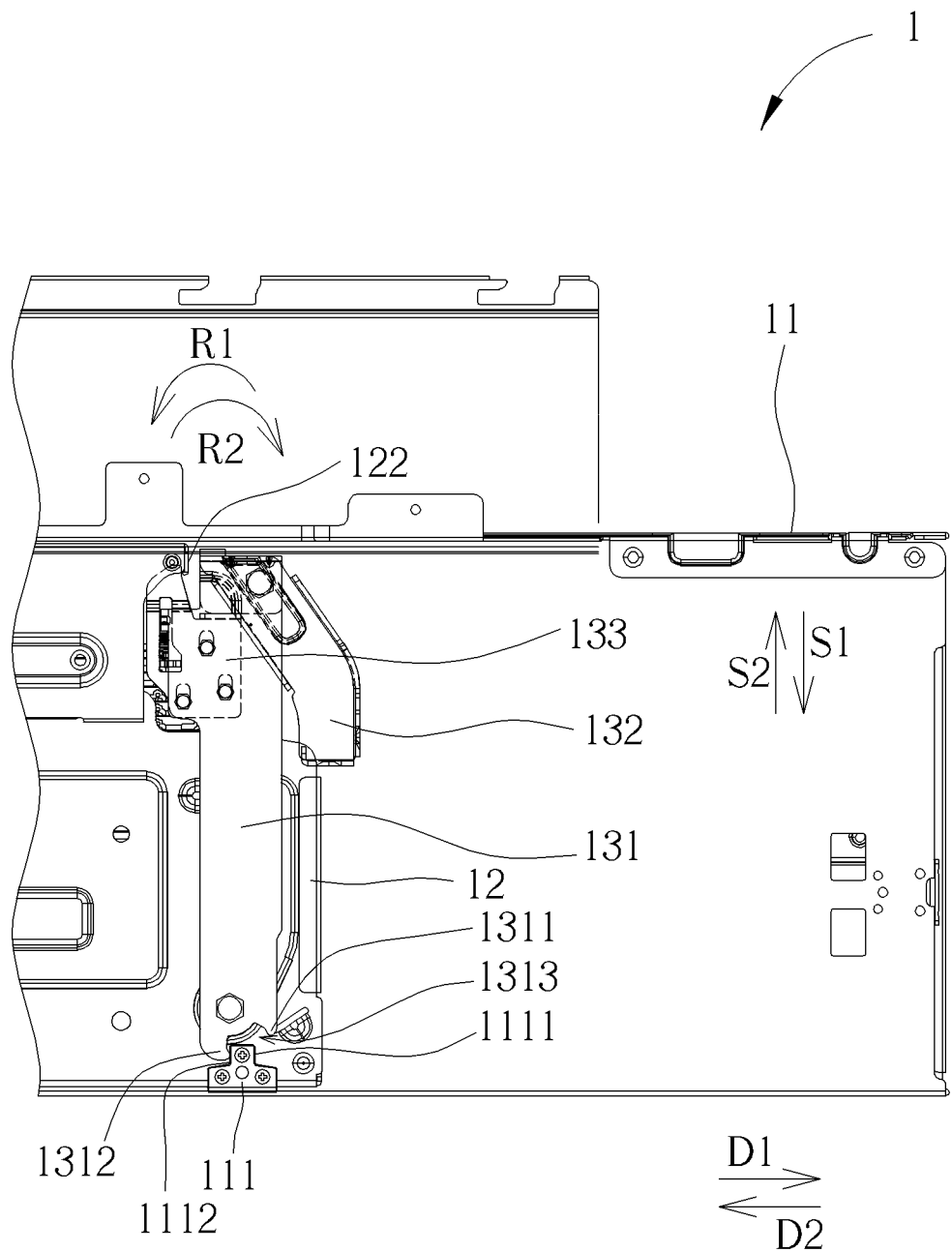
FIG. 9 is a partial enlarged diagram of the electronic apparatus in the first state according to the embodiment of the present invention.
Figure 10:
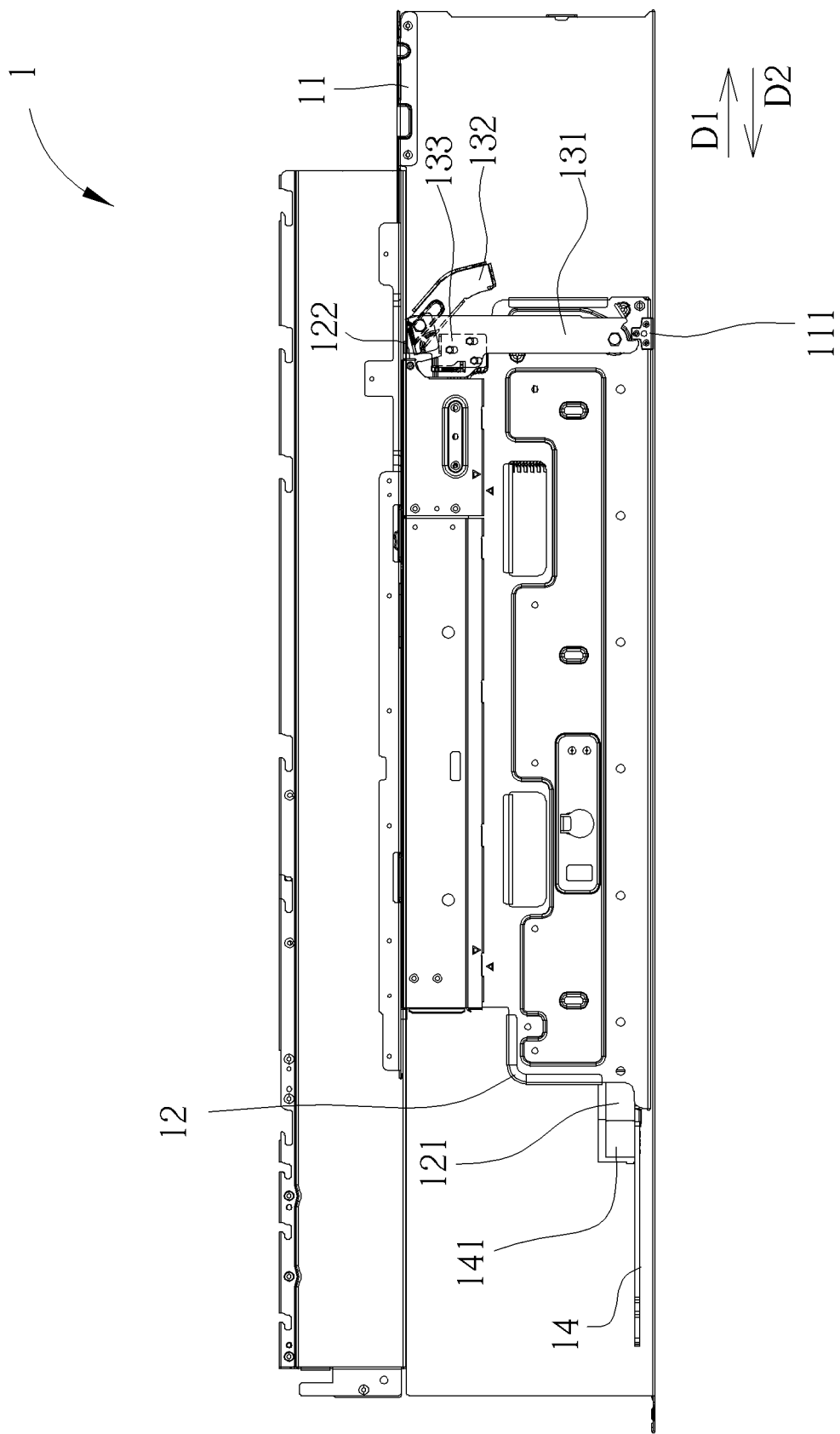
FIG. 10 is a diagram of the electronic apparatus in a second state according to the embodiment of the present invention.
Figure 11:
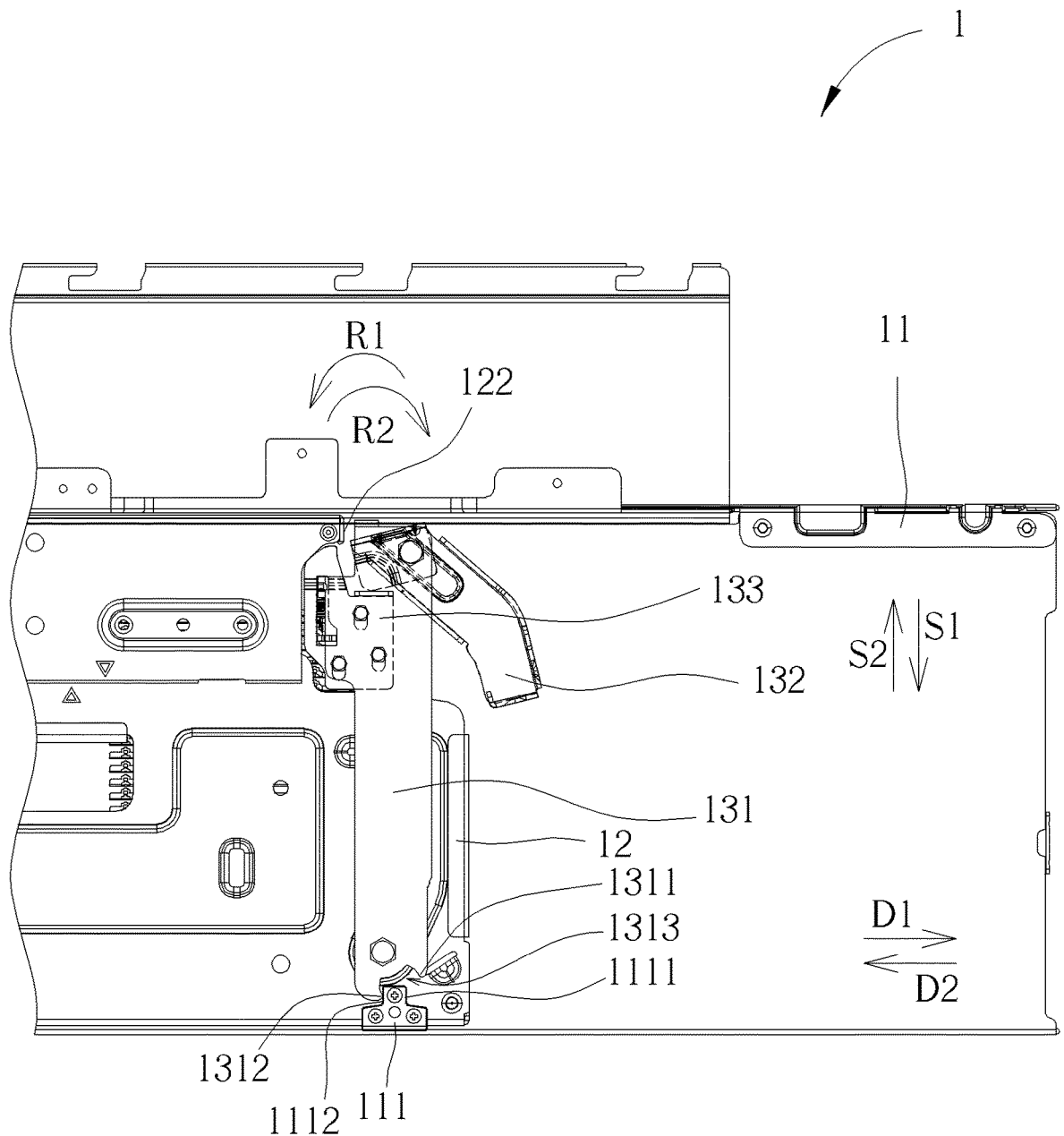
FIG. 11 is a partial enlarged diagram of the electronic apparatus in the second state according to the embodiment of the present invention.
Figure 12:
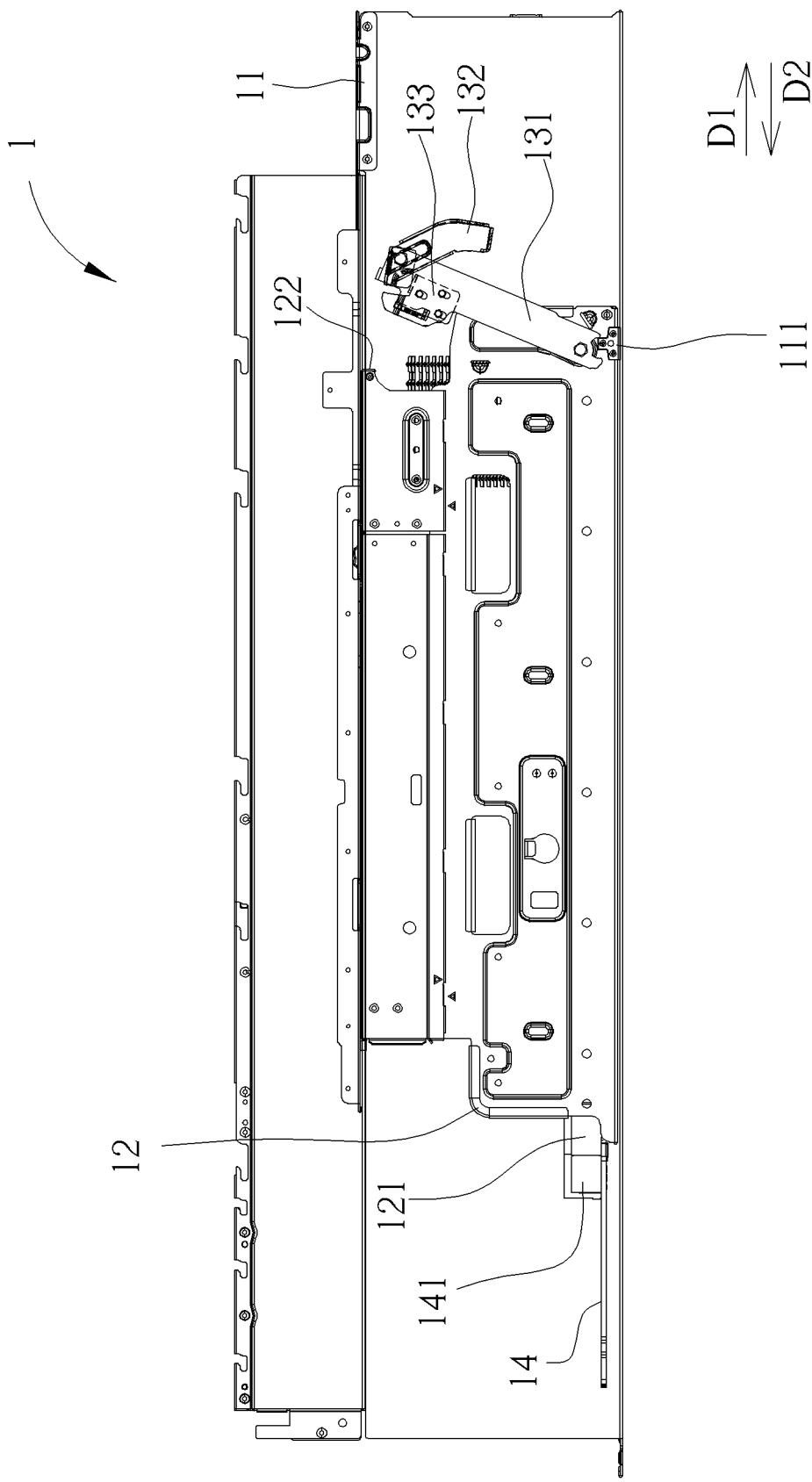
FIG. 12 is a diagram of the electronic apparatus in a third state according to the embodiment of the present invention.
Figure 13:
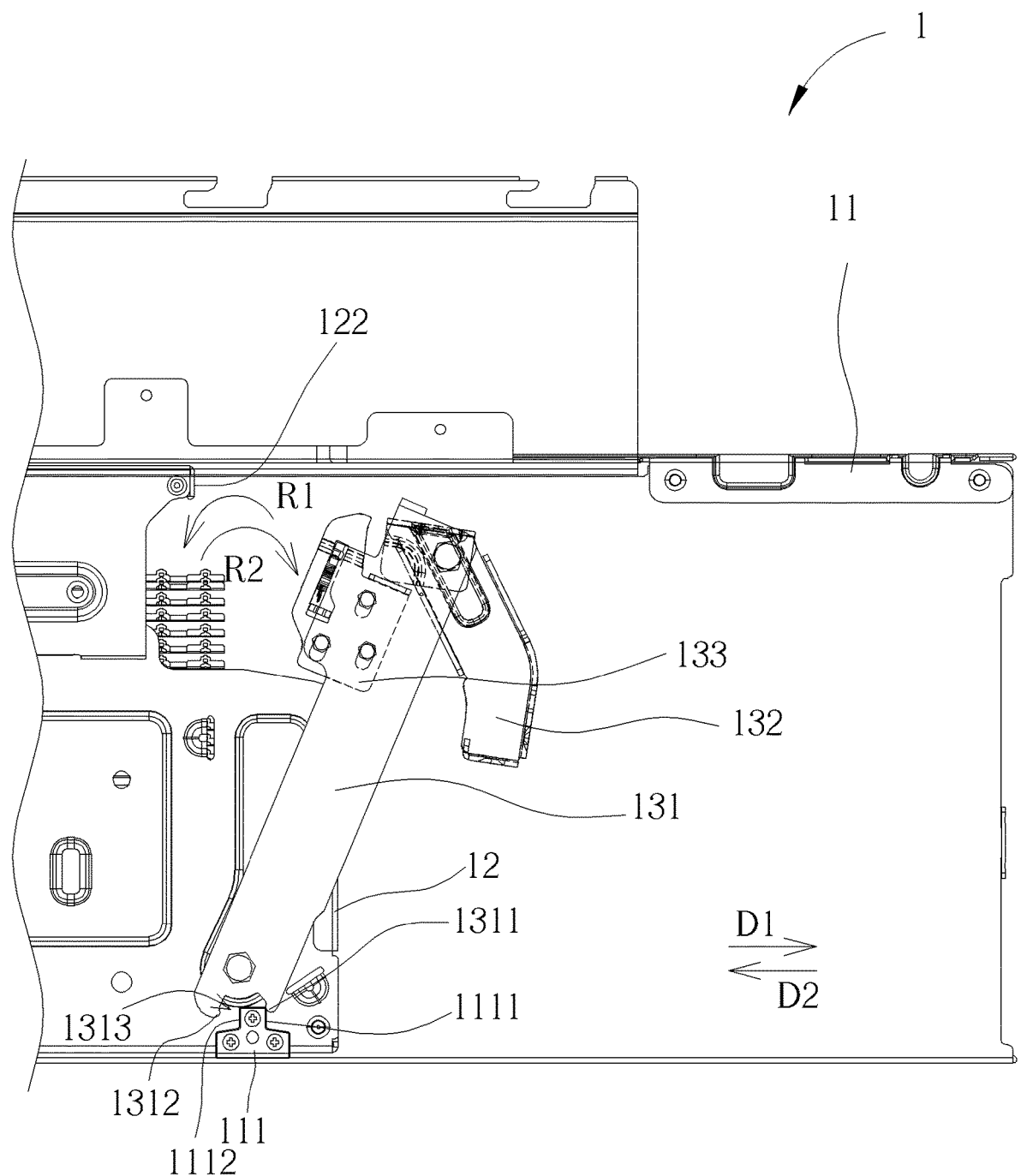
FIG. 13 is a partial enlarged diagram of the electronic apparatus in the third state according to the embodiment of the present invention.
Figure 14:
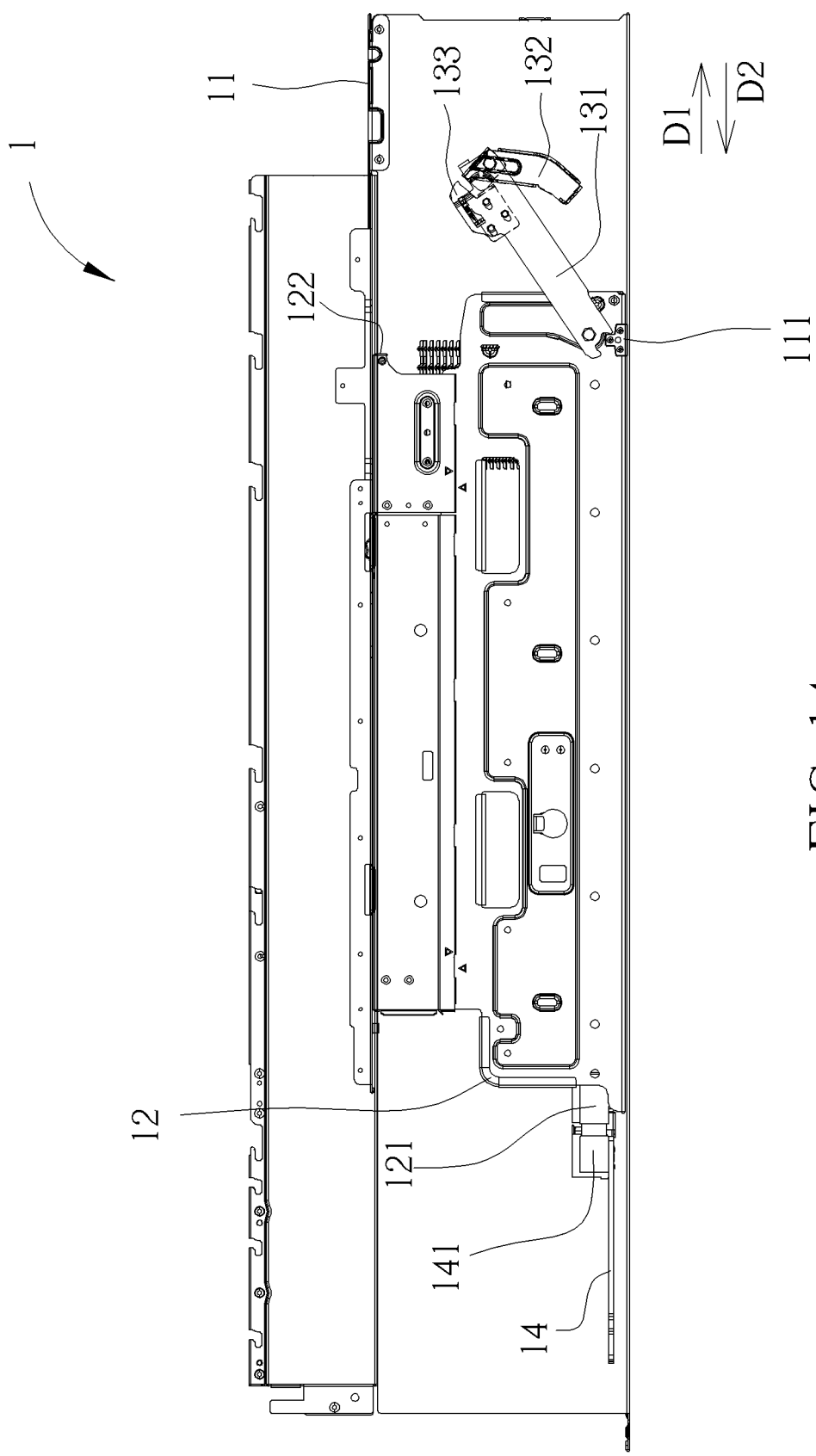
FIG. 14 is a diagram of the electronic apparatus in a fourth state according to the embodiment of the present invention.
Figure 15:
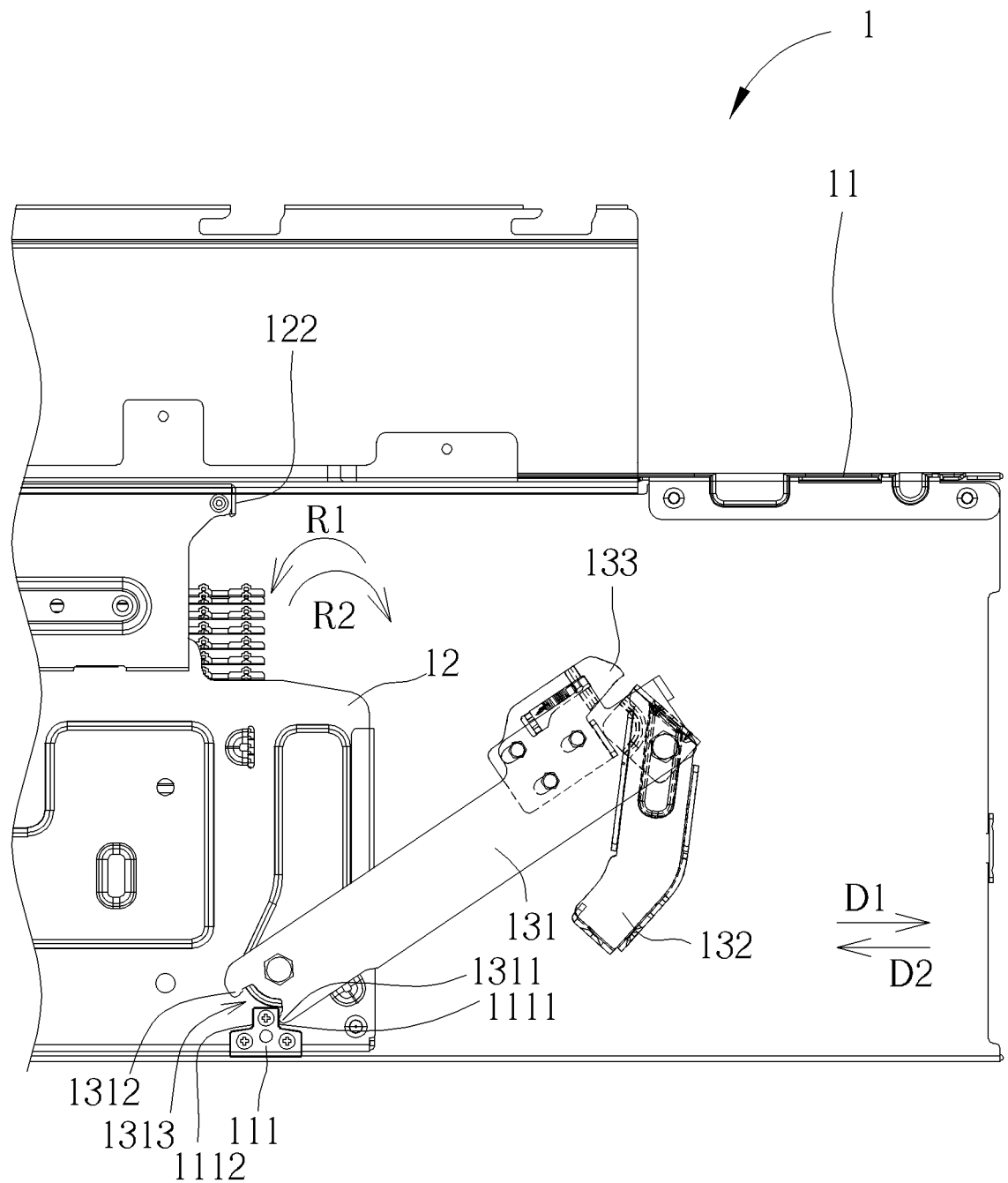
FIG. 15 is a partial enlarged diagram of the electronic apparatus in the fourth state according to the embodiment of the present invention.

Please refer to FIG. 8 to FIG. 15. FIG. 8 is a diagram of the electronic apparatus 1 in a first state according to the embodiment of the present invention. FIG. 9 is a partial enlarged diagram of the electronic apparatus 1 in the first state according to the embodiment of the present invention. FIG. 10 is a diagram of the electronic apparatus 1 in a second state according to the embodiment of the present invention. FIG. 11 is a partial enlarged diagram of the electronic apparatus 1 in the second state according to the embodiment of the present invention. FIG. 12 is a diagram of the electronic apparatus 1 in a third state according to the embodiment of the present invention. FIG. 13 is a partial enlarged diagram of the electronic apparatus 1 in the third state according to the embodiment of the present invention. FIG. 14 is a diagram of the electronic apparatus 1 in a fourth state according to the embodiment of the present invention. FIG. 15 is a partial enlarged diagram of the electronic apparatus 1 in the fourth state according to the embodiment of the present invention. Detailed description for operation of the present invention is provided as follows. When it is desired to detach the detachable module 12 from the case 11, the second pivoting component 132 can be operated to pivot relative to each of the first pivoting components 131 from a position as shown in FIG. 8 and FIG. 9 to a position as shown in FIG. 10 and FIG. 11 in the first pivoting direction R1, so as to push each of the first engaging components 133 to move in the first moving direction S1 to disengage from the second engaging component 122. After each of the first engaging components 133 disengages from the second engaging component 122, each of the first pivoting components 131 can be operated to move from a position as shown in FIG. 10 and FIG. 11, i.e., the vertical position, to a position as shown in FIG. 12 and FIG. 13, i.e., the inclined position, in the second pivoting direction R2, so that each of the first pushing portions 1311 abuts against the corresponding first pushed portion 1111. Afterwards, when each of the first pivoting components 131 is further operated to move from the position as shown in FIG. 12 and FIG. 13 to a position as shown in FIG. 14 and FIG. 15 in the second pivoting direction R2, each of the first pushing portions 1311 pushes the corresponding first pushed portion 1111 for driving the detachable module 12 to move relative to the case 11 in the detaching direction D1, so as to separate the first electrical connector 121 of the detachable module 12 from the second electrical connector 141 of the circuit board 14 for achieving the detachment of the detachable module 12 from the case 11.

On the other hand, when it is desired to install the detachable module 12 on the case 11, each of the first pivoting components 131 can be operated to pivot relative to the detachable module 12 from the position as shown in FIG. 14 and FIG. 15 to the position as shown in FIG. 8 and FIG. 9 in the first pivoting direction R1. When each of the first pivoting components 131 pivots relative to the detachable module 12 from the position as shown in FIG. 14 and FIG. 15 to the position as shown in FIG. 8 and FIG. 9 in the first pivoting direction R1, each of the second pushing portions 1312 pushes the corresponding second pushed portion 1112 for driving the detachable module 12 to move in the installing direction D2, so as to mate the first electrical connector 121 of the detachable module 12 with the second electrical connector 141 of the circuit board 14 for achieving the installation of the detachable module 12 on the case 11. Furthermore, when each of the first pivoting components 131 is located at the position as shown in FIG. 8 and FIG. 9 relative to the detachable module 12, each of the recovering components 134 can drive the corresponding first engaging component 133 to engage with the second engaging component 122 for preventing an unintentional pivoting movement of the corresponding first pivoting component 131 in the second pivoting direction R2, and each of the second pushing portions 1312 abuts against the corresponding second pushed portion 1112 for preventing an unintentional movement of the detachable module 12 relative to the case 11 in the detaching direction D1.

It should be noticed that the function and the operation of the first pivoting component are not limited to this embodiment. For example, in another embodiment, the first pivoting component can include the first pushing portion only, and the second pushing portion can be omitted, so that a pivoting movement of the first pivoting component can drive the detachable module to move in the detaching direction but cannot drive the detachable module to move in the installing direction. Alternatively, in another embodiment, the abutting component can be omitted, so that the pivoting movement of the first pivoting component cannot drive the detachable module to move in the detaching direction, i.e., the user has to operate the operating assembly to apply a force on the detachable module in the detaching direction for achieving the detachment of the detachable module from the case after the first engaging components disengage from the second engaging component.

In contrast to the prior art, the present invention utilizes the second pivoting component to drive the first engaging component to disengage from the second engaging component for allowing the first pivoting component to pivot relative to the detachable module. Besides, the present invention further utilizes the first pivoting component to push the abutting component for driving the detachable module to move in the detaching direction. The present invention allows a user to sequentially operate the second pivoting component and the first pivoting component to pivot to achieve detachment of the detachable module. Therefore, the present invention has better operability. In addition, the configuration of the present invention has fewer parts and occupies less space. Therefore, the present invention has simple structure and increased space utilization.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chassis device for a detachable module, the chassis device comprising:
   a case for installing the detachable module; and
   an operating assembly comprising:
      at least one first pivoting component pivotally connected to the detachable module;
      a second pivoting component pivotally connected to the at least one first pivoting component; and
      at least one first engaging component movably disposed on the at least one first pivoting component, the at least one first engaging component being for removably engaging with at least one second engaging component of the detachable module, the at least one first pivoting component being restrained from pivoting when the at least one first engaging component engages with the at least one second engaging component of the detachable module, and when the second pivoting component pivots in a first pivoting direction to push the at least one first engaging component to move in a first moving direction, the at least one first engaging component disengaging from the at least one second engaging component of the detachable module.

2. The chassis device of claim 1, wherein the at least one first pivoting component comprises a first pushing portion, the case comprises at least one abutting component, the at least one abutting component comprises a first pushed portion, and the first pushing portion pushes the first pushed portion to drive the detachable module to move relative to the case in a detaching direction when the at least one first pivoting component pivots in a second pivoting direction opposite to the first pivoting direction.

3. The chassis device of claim 2, wherein the at least one first pivoting component further comprises a second pushing portion, the at least one abutting component further comprises a second pushed portion, and the second pushing portion pushes the second pushed portion to drive the detachable module to move relative to the case in an installing direction opposite to the detaching direction when the at least one first pivoting component pivots in the first pivoting direction.

4. The chassis device of claim 3, wherein the at least one first pivoting component further comprises an arc-shaped recess structure, the first pushing portion and the second pushing portion are respectively located at two opposite sides of the arc-shaped recess structure, and the at least one abutting component is partially located within the arc-shaped recess structure.

5. The chassis device of claim 4, wherein the first pushing portion does not abut against the first pushed portion and the second pushing portion abuts against the second pushed portion when the at least one first engaging component engages with the at least one second engaging component of the detachable module.

6. The chassis device of claim 1, wherein the second pivoting component comprises at least one bending portion and an operating portion, the at least one bending portion comprises a first connecting end and a second connecting end, the first connecting end is pivotally connected to the at least one first pivoting component, the second connecting end is connected to the operating portion.

7. The chassis device of claim 1, wherein the operating assembly further comprises at least one first guiding component and at least one second guiding component, the at least one first guiding component is disposed on the at least one first pivoting component, the at least one second guiding component is disposed on the at least one first engaging component and configured to cooperate with the at least one first guiding component.

8. The chassis device of claim 1, wherein the operating assembly further comprises at least one recovering component disposed between the at least one first engaging component and the at least one first pivoting component.

9. The chassis device of claim 1, wherein the at least one first pivoting component comprises a stopping structure configured to restrain a pivoting angle of the second pivoting component relative to the at least one first pivoting component.

10. An electronic apparatus comprising:
a chassis device comprising:
an operating assembly comprising:
at least one first pivoting component;
a second pivoting component pivotally connected to the at least one first pivoting component; and
at least one first engaging component movably disposed on the at least one first pivoting component; and
a case; and
a detachable module installed on the case, the at least one first pivoting component being pivotally connected to the detachable module, the detachable module comprising at least one second engaging component, the at least one first engaging component being for removably engaging with the at least one second engaging component, the at least one first pivoting component being restrained from pivoting when the at least one first engaging component engages with the at least one second engaging component, and when the second pivoting component pivots in a first pivoting direction to push the at least one first engaging component to move in a first moving direction, the at least one first engaging component disengaging from the at least one second engaging component.

11. The electronic apparatus of claim 10, wherein the at least one first pivoting component comprises a first pushing portion, the case comprises at least one abutting component, the at least one abutting component comprises a first pushed portion, and the first pushing portion pushes the first pushed portion to drive the detachable module to move relative to the case in a detaching direction when the at least one first pivoting component pivots in a second pivoting direction opposite to the first pivoting direction.

12. The electronic apparatus of claim 11, wherein the at least one first pivoting component further comprises a second pushing portion, the at least one abutting component further comprises a second pushed portion, and the second pushing portion pushes the second pushed portion to drive the detachable module to move relative to the case in an installing direction opposite to the detaching direction when the at least one first pivoting component pivots in the first pivoting direction.

13. The electronic apparatus of claim 12, wherein the at least one first pivoting component further comprises an arc-shaped recess structure, the first pushing portion and the second pushing portion are respectively located at two opposite sides of the arc-shaped recess structure, and the at least one abutting component is partially located within the arc-shaped recess structure.

14. The electronic device of claim 10, wherein the second pivoting component comprises at least one bending portion and an operating portion, the at least one bending portion comprises a first connecting end and a second connecting end, the first connecting end is pivotally connected to the at least one first pivoting component, the second connecting end is connected to the operating portion.

15. The electronic device of claim 10, wherein the operating assembly further comprises at least one first guiding component and at least one second guiding component, the at least one first guiding component is disposed on the at least one first pivoting component, the at least one second guiding component is disposed on the at least one first engaging component and configured to cooperate with the at least one first guiding component.

16. The electronic device of claim 10, wherein the operating assembly further comprises at least one recovering component disposed between the at least one first engaging component and the at least one first pivoting component.

17. The electronic device of claim 10, wherein the at least one first pivoting component comprises a stopping structure configured to restrain a pivoting angle of the second pivoting component relative to the at least one first pivoting component.

18. An operating assembly for a detachable module, the detachable module being installed on a case, the operating assembly comprising:
at least one first pivoting component pivotally connected to the detachable module;
a second pivoting component pivotally connected to the at least one first pivoting component; and
at least one first engaging component movably disposed on the at least one first pivoting component and for removably engaging with at least one second engaging component of the detachable module, the at least one first pivoting component being restrained from pivoting when the at least one first engaging component engages with the at least one second engaging component, and when the second pivoting component pivots in a first pivoting direction to push the at least one first engaging component to move in a first moving direction, the at least one first engaging component disengaging from the at least one second engaging component.

19. The operating assembly of claim 18, wherein the at least one first pivoting component comprises a first pushing portion, and the first pushing portion pushes a first pushed portion of at least one abutting component of the case to drive the detachable module to move relative to the case in a detaching direction when the at least one first pivoting component pivots in a second pivoting direction opposite to the first pivoting direction.

20. The operating assembly of claim 19, wherein the at least one first pivoting component further comprises a second pushing portion, and the second pushing portion pushes a second pushed portion of the at least one abutting component of the case to drive the detachable module to move relative to the case in an installing direction opposite to the detaching direction when the at least one first pivoting component pivots in the first pivoting direction.

* * * * *